(12) United States Patent
Shen

(10) Patent No.: US 6,644,397 B1
(45) Date of Patent: Nov. 11, 2003

(54) COMBINATION SINK

(76) Inventor: Chi-Chang Shen, 1F, No. 1-1, Wang Tzu Street, Chung-Li City, Tayuang County (TW)

( * ) Notice: Subject to any disclaimer, the term of this patent is extended or adjusted under 35 U.S.C. 154(b) by 0 days.

(21) Appl. No.: 10/329,562

(22) Filed: Dec. 27, 2002

(51) Int. Cl.[7] ............................... F28F 7/00; H05K 7/20
(52) U.S. Cl. ...................... 165/185; 165/80.3; 361/704
(58) Field of Search .................. 165/185, 80.3; 361/704, 697, 710; 257/719, 722; 174/16.3

(56) References Cited

U.S. PATENT DOCUMENTS

| | | | | |
|---|---|---|---|---|
| 2,434,676 A | * | 1/1948 | Spender ..................... | 165/185 |
| 5,529,120 A | * | 6/1996 | Howard et al. ........ | 165/104.33 |
| 6,104,609 A | * | 8/2000 | Chen .......................... | 361/695 |
| 6,267,178 B1 | * | 7/2001 | Chen .......................... | 165/185 |
| 6,336,498 B1 | * | 1/2002 | Wei ............................ | 165/80.3 |
| 6,340,056 B1 | * | 1/2002 | Huang et al. ............... | 165/185 |
| 6,386,275 B1 | * | 5/2002 | Kuo et al. .................. | 165/80.3 |
| 6,474,407 B1 | * | 11/2002 | Chang et al. .............. | 165/80.3 |

* cited by examiner

Primary Examiner—Henry Bennett
Assistant Examiner—Tho V Duong
(74) Attorney, Agent, or Firm—Troxell Law Office PLLC

(57) ABSTRACT

A combination sink is comprised of multiple heat sinks made of sheet metal overlapped one another; each heat sink being provided with a base plate, a side wall being each provided to both longer sides of the base plate, one or more than one tab being adapted to the side wall, a slot being provided in the tab, a matching latch being provided on the base plate to be inserted through the slot in the base plate of another heat sink above.

2 Claims, 4 Drawing Sheets

COMBINATION SINK

BACKGROUND OF THE INVENTION (a) Field of the Invention

The present invention is related to a combination sink, and more particularly, to one that has the multiple heat sinks overlapped on one another to allow easy assembly, lower production cost and promoted production capacity.

(b) Description of the Prior Art

The prior art of a sink is usually related to an integrated structure of extruded or cast aluminum alloy. It indicates a specific dimension that limits its range of application. Its limited number of heat sinks directly affects the cooling effect of the sink. An improved structure of combination sink, such as a lamination hybrid sink (Utility Patent Application No. 388608, ROC Gazette) has become generally available in the market. The improvement related to a sink comprised of multiple metal plates overlapped on one another to provide additional cooling area.

However, a basic unit erected with insertion board is required for the assembly of those multiple heat sinks and slot is provided on each heat sink to receive insertion by the insertion board to hold the heat sink in position. Finally, a locking board is placed over the utmost top heat sink to lock up the basic unit, thus the entire sink. Each component requires the development of a mold and too many components add complication in the assembly resulting in higher production cost. Furthermore, the height of the improvement for being subject to the existing height of the insertion board gives less variety for the application of the sink.

SUMMARY OF THE INVENTION

The primary purpose of the present invention is to provide a combination sink that allows a firm structure. To achieve the purpose, longer sides of each base plate of a heat sink are respectively provided with a sidewall and at least one tab is provided on the sidewall. A slot is provided on the tab and a matching latch is provided on the base plate. The heat sink below is closely adhered to another heat sink above by having the latch on the plate below to be inserted through the slot to lock up the tab above.

Another purpose of the present invention is to provide a combination sink that allows easy assembly, improved production capacity and lower production cost. To achieve the purpose, all the heat sinks are overlapped on one another by means of the tab and the latch instead of an additional insertion board as observed with the prior art.

DETAILED DESCRIPTION OF THE PREFERRED EMBODIMENTS

Figure 1:
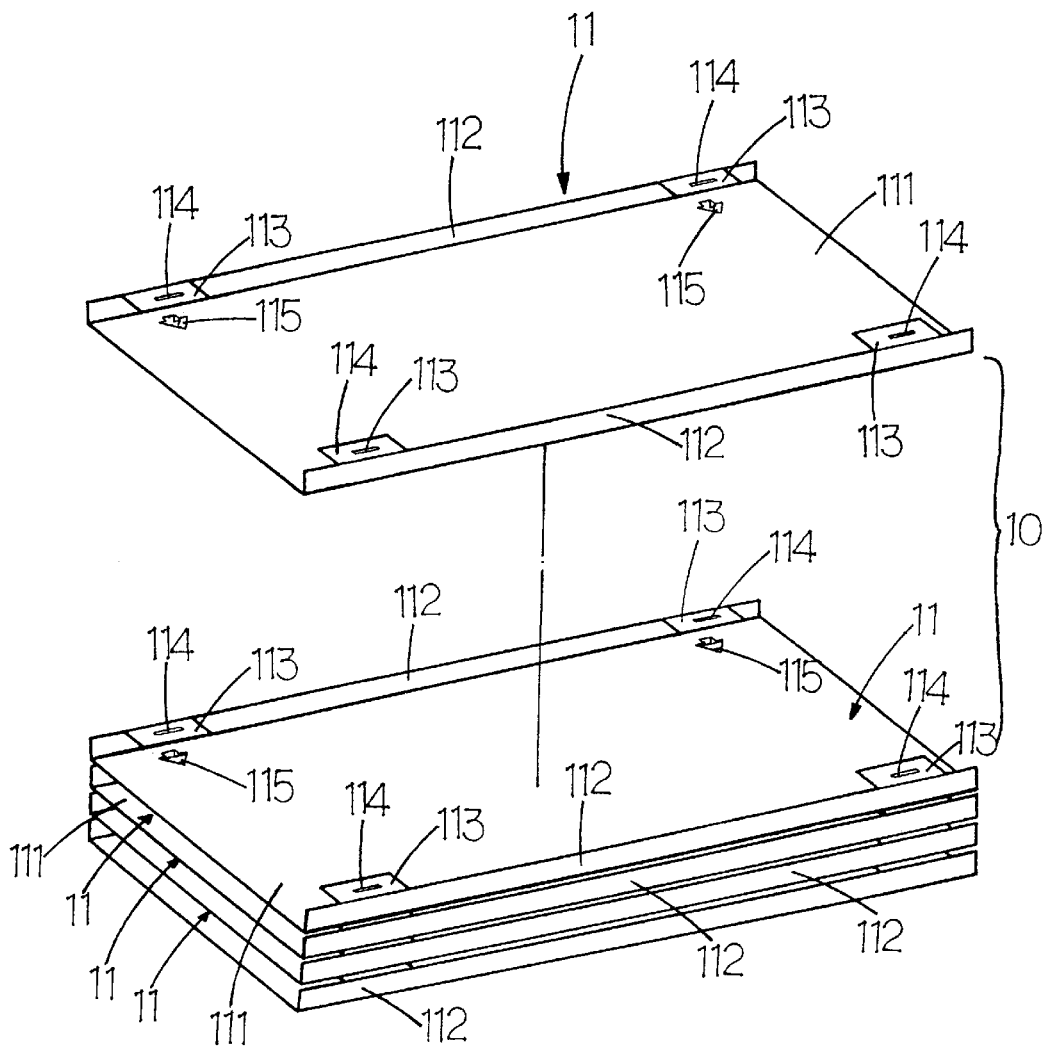
FIG. 1 is an exploded view of a preferred embodiment of the present invention.
Figure 2:
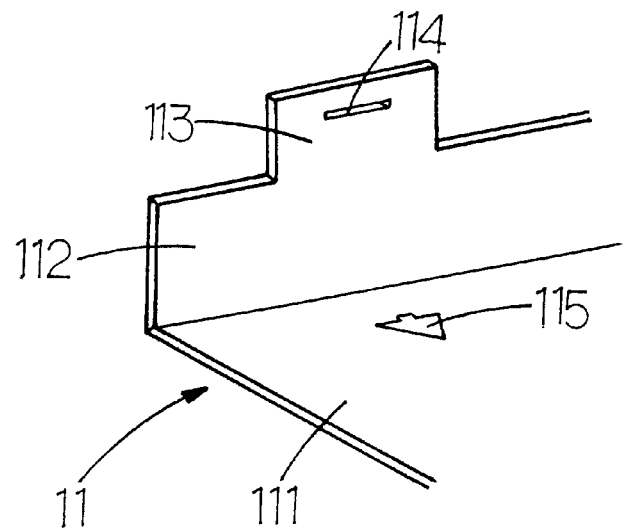
FIG. 2 is a schematic view showing the formation of a tab and a latch of the preferred embodiment of the present invention.
Figure 3:
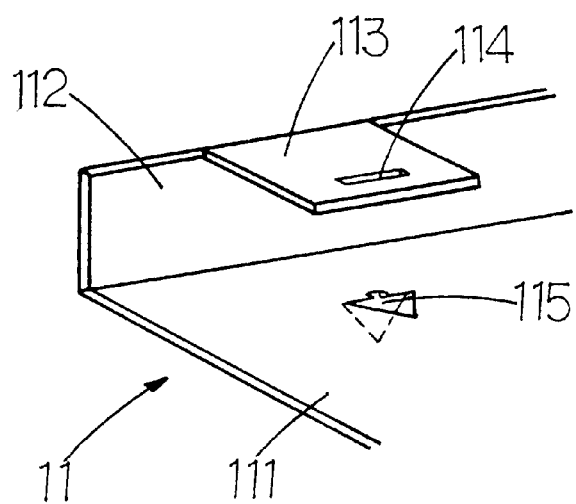
FIG. 3 is another schematic view showing the formation of a tab and a latch of the preferred embodiment of the present invention.

Referring to FIG. 1 for a preferred embodiment of the present invention, a combination sink 10 is comprised of multiple heat sinks 11 overlapped on one another in a deck. Each heat sink 11 is made of sheet metal and includes a base plate 111 and two sidewalls 112 respectively provided on both longer sides of the plate 111. One or more than one tab 113 is provided at where appropriately on the side wall 112. Also as illustrated in FIGS. 2 and 3, the heat sink 11 is forthwith formed by pressing the sheet metal. The tab 113 extends towards the inner side of the heat sink 11 and is disposed in parallel with the base plate 111. A slot 114 is provided on the tab 113 in parallel with longer sides of the tab 113. A latch 115 having an arrow shape tip is provided on the base plate 111 at where corresponds to the tab 113. The latch 115 folds downward once it is inserted through the slot 114 of the tab 113 from another heat sink 11 below to hold both heat sinks 11 in position.

Figure 4:
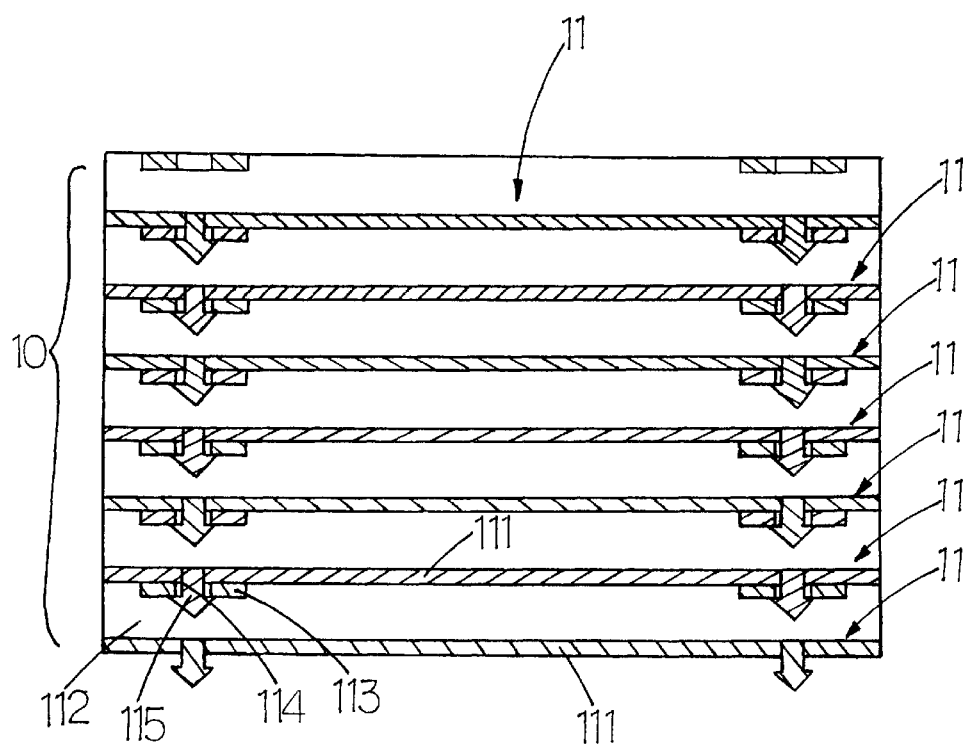
FIG. 4 is a sectional view of a structure of the preferred embodiment of the present invention.
Figure 5:
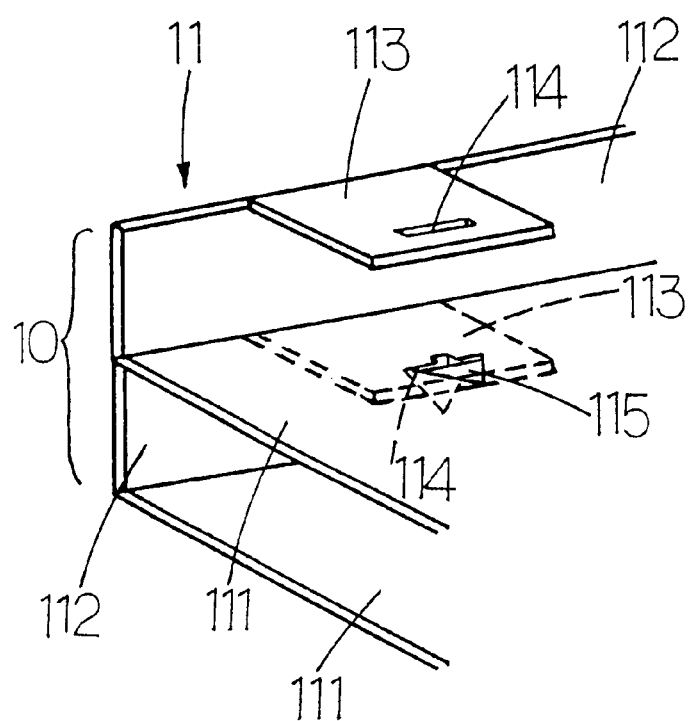
FIG. 5 is a schematic view showing that the latch is inserted through a slot in the tab of the preferred embodiment of the present invention.

Depending on the size of the space available for the installation of the sink 10, the quantity of the heat sink 11 is determined. All the heat sinks 11 are overlapped on one another in sequence to form a deck as illustrated in FIGS. 4 and 5. Wherein, the latch 115 bent over downward from the base plate 111 of the upper heat sink 11 is inserted through the slot 114 on the tab 113 of the lower heat sink 11 for both of the tab 113 and the latch 115 to lock to each other so that both of the upper and the lower heat sinks are close secured in the deck. A proper space is defined by the side walls 112 of each heat sink 11 to provide good cooling channel between any two abutted heat sinks 11, thus to enable each base plate 111 of the heat sink to provide optimal cooling effect.

The present invention for eliminating an insertion board to penetrate through all the heat sinks and a locking cover plate as required by the prior art gives the benefits of lower production cost, easier assembly process and improved production capacity.

Furthermore, the present invention provides an improved structure for the combination sink. Wherein, any two abutted heat sinks in the deck are tightly secured to each other when overlapped on each other by having the latch from the base plate of the upper heat sink to be inserted through the slot on the tab from the lower heat sink and bent downward to lock up the tab for the entire deck to form a firm sink. Therefore, a utility patent for the present invention is duly filed accordingly.

I claim:

1. A combination sink is comprised of multiple heat sinks overlapped on one another; each heat sink formed by a sheet metal having a base plate; a side wall being each provided on both longer sides of the base plate; at least one tab being provided at where appropriately on each side wall; the tab extending toward the inner side of the heat sink and being disposed in parallel with the base plate characterized by that:

a slot being provided on the tab; a latch bendable downward being provided on the base plate at where corresponding to the tab; the latch from an upper base plate being inserted through the slot on the tab from the lower base plate to lock up the tab; and both of the upper and the lower heat sinks being tightly adhered to each other.

2. A combination sink as claimed in claim 1, wherein, the front end of the latch indicates an arrow shape.

* * * * *